Figure 1:
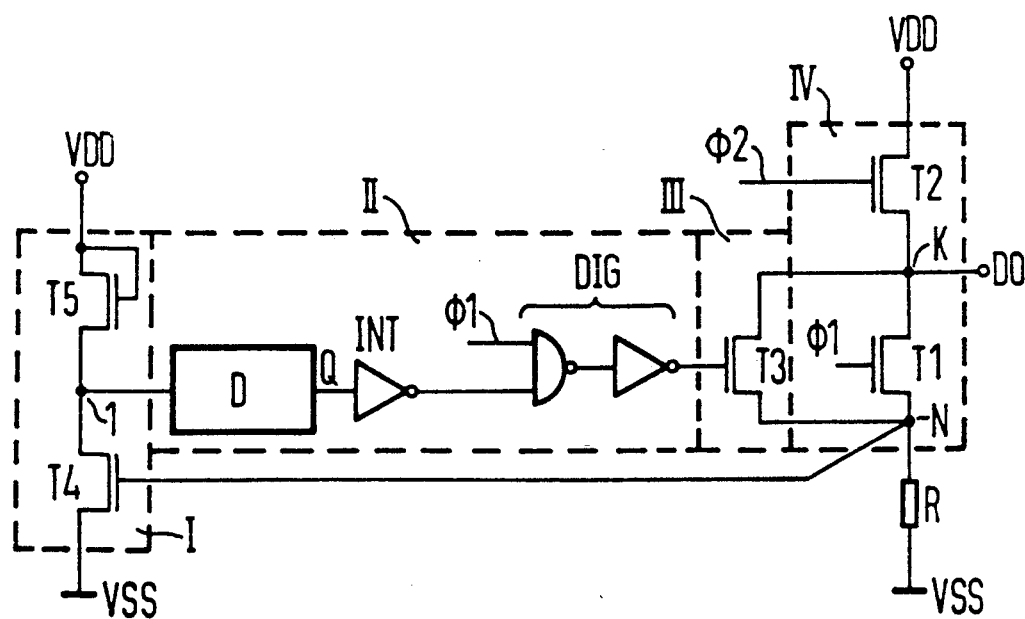

United States Patent [19]

Pribyl et al.

[11] Patent Number: 5,091,658
[45] Date of Patent: Feb. 25, 1992

[54] CIRCUIT CONFIGURATION FOR NOISE SIGNAL COMPENSATION

[75] Inventors: Wolfgang Pribyl, Graz, Austria; Johann Harter, Reichertshausen, Fed. Rep. of Germany

[73] Assignee: Siemens Aktiengesellschaft, Munich, Fed. Rep. of Germany

[21] Appl. No.: 438,333

[22] Filed: Nov. 16, 1989

[30] Foreign Application Priority Data

Nov. 17, 1988 [EP] European Pat. Off. ........ 88119151.4

[51] Int. Cl.⁵ .................... H03K 17/16; H03B 1/00
[52] U.S. Cl. ................................. 307/443; 307/520
[58] Field of Search .......................... 307/520, 443

[56] References Cited

U.S. PATENT DOCUMENTS

| | | | |
|---|---|---|---|
| 3,534,282 | 10/1970 | Day | 330/149 |
| 3,969,637 | 7/1976 | Minami et al. | 307/237 |
| 4,575,650 | 3/1986 | Naimpally et al. | 307/520 |
| 4,609,834 | 9/1986 | Gal | 307/520 |
| 4,740,717 | 4/1988 | Fletcher et al. | 307/443 |
| 4,758,743 | 7/1988 | Dehganpour et al. | 307/443 |
| 4,782,252 | 11/1988 | Levy et al. | 307/443 |
| 4,791,521 | 12/1988 | Ouyang et al. | 307/520 |
| 4,918,332 | 4/1990 | Nix | 307/443 |
| 4,959,561 | 9/1990 | McDermott | 307/443 |

FOREIGN PATENT DOCUMENTS

| | | |
|---|---|---|
| 0186385 | 7/1986 | European Pat. Off. |
| 60-74719 | 4/1985 | Japan |
| 1122160 | 7/1967 | United Kingdom |

Primary Examiner—David Hudspeth
Assistant Examiner—Andrew Sanders
Attorney, Agent, or Firm—Herbert L. Lerner; Laurence A. Greenberg

[57] ABSTRACT

A circuit configuration for compensating for noise signals occurring in a component circuit of an integrated semiconductor circuit includes a sensor circuit for detecting and converting noise signals that occur. A converter circuit is connected to the sensor circuit for preparing and converting the detected noise signals into logic levels. A control element is connected between the converter circuit and the component circuit for controlling the flow of current in the component circuit.

9 Claims, 1 Drawing Sheet

CIRCUIT CONFIGURATION FOR NOISE SIGNAL COMPENSATION

The invention relates to a circuit configuration for compensating for noise signals occurring in a component circuit of an integrated semiconductor circuit.

In integrated circuits, particularly on potential lines, undesirable current peaks expressed as noise signals (so-called on-chip noise) occur. The noise signals threaten the functional reliability of the integrated semiconductor circuit, because they can cause faulty connections or switching. The occurrence of the noise signals is particularly critical in large scale and super large scale integrated semiconductor circuits, because of the minimal structural width of the electric conductor tracks of such circuits. Yet if the structural width is minimized, this automatically increases the likelihood that the noise signals will occur.

Although it was desirable and feasible to minimize these structural widths in the past, for instance by lithography, this was generally not done because of the need to keep the occurrence of noise signals to a minimum.

By now, it has also been learned that noise signals occur especially in output stages of circuit components, because higher currents (output "drivers") usually flow in output stages rather than in other circuit components of integrated semiconductor circuits. Accordingly, continuously operating current-limiting means were often provided, but they entail a corresponding undesirable loss in operating speed.

It is accordingly an object of the invention to provide a circuit configuration for noise signal compensation, which overcomes the hereinafore-mentioned disadvantages of the heretofore-known devices devices of this general type and which keeps the influence of noise signals at a minimum, without having to tolerate the above-mentioned disadvantages in return.

With the foregoing and other objects in view there is provided, in accordance with the invention, a circuit configuration for compensating for noise signals occurring in a component circuit of an integrated semiconductor circuit, comprising a sensor circuit for detecting and converting noise signals that occur; a converter circuit connected to the sensor circuit for preparing and converting the detected noise signals into logic levels; and a control element connected between the converter circuit and the component circuit for controlling the flow of current in the component circuit.

In accordance with another feature of the invention, the component circuit is connected to first and second supply potentials, and has a point at which the noise signals to be compensated for occur; the sensor circuit includes a load device, and a transistor having a source, a drain and a gate; the source of the transistor is connected to the first supply potential; the drain of the transistor is highly resistively connected through the load device to the second supply potential; and the gate of the transistor is connected to the point at which the noise signals to be compensated for occur.

In accordance with a further feature of the invention, the component circuit is triggered by a signal; the sensor circuit has an output; and the converter circuit includes an integrator, a discriminator circuit upstream of the integrator for evaluating the noise signals present at the output of the sensor circuit and converted by the sensor circuit as interference signals and for upwardly integrating the noise signals; and a digitizing system downstream of the integrator for converting the upwardly integrated interference signals into digital signals while taking the signal triggering the component circuit into account and furnishing the digital signals to the control element as an input variable.

In accordance with an added feature of the invention, the component circuit has a point at which the noise signals occur and a circuit node within the component circuit, and the control element includes a transistor having a source, a drain and a gate, the source of the transistor is connected to the point at which the noise signals occur, the drain of the transistor is connected to the circuit node, and the gate of the transistor forms a control input of the control element.

In accordance with an additional feature of the invention, the first supply potential is more negative than the second supply potential.

In accordance with yet another feature of the invention, the first supply potential is more positive than the second supply potential.

In accordance with yet a further feature of the invention, the transistor of the sensor circuit has an operating voltage being at most 10% or 20% of the difference between the supply potentials in terms of amount.

In accordance with a concomitant feature of the invention, there is provided at least one conductor track being connected to one of the supply potentials and having parasitic resistances causing noise signals being compensated for by the circuit configuration.

Other features which are considered as characteristic for the invention are set forth in the appended claims.

Although the invention is illustrated and described herein as embodied in a circuit configuration for noise signal compensation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
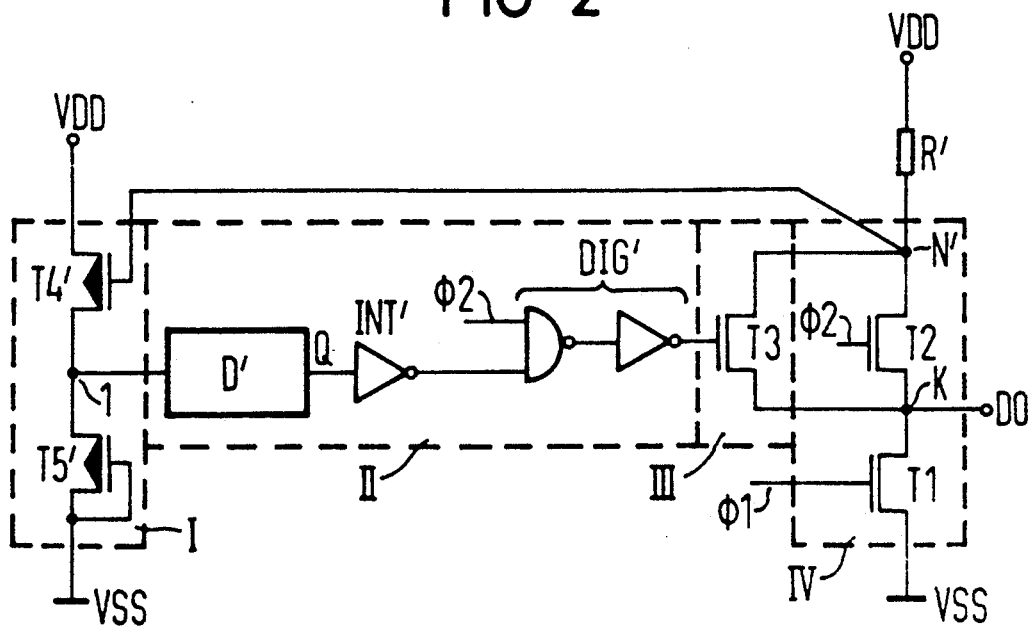

FIGS. 1 and 2 are schematic circuit diagrams showing exemplary embodiments of the invention.

Referring now to the figures of the drawings in detail and first, particularly, to FIG. 1 thereof, there is seen a typical NMOS output stage having transistors T1, T2 as a component circuit IV susceptible to noise signals in an integrated semiconductor circuit. The transistors T1, T2 are triggered at the gate, in the usual fashion, with signals 01, 02, which determine the output level of an output signal DO produced at the output stage. As is also usual, the output stage is connected to a first supply potential VSS and a second supply potential VDD. The first supply potential VSS is assumed to be more negative than the second supply potential VDD, in accordance with the internationally accepted nomenclature for NMOS and CMOS circuits. A resistor R symbolically represents the parasitic resistance of conductor tracks or printed wire conductors for the first supply potential VSS, which is present in principle in every circuit. According to Ohm's Law, current peaks or fast changes in current develop the deleterious noise signals at this resistor.

The output stage forming the component circuit IV is preceded by a sensor circuit I, a converter circuit II and a control element or final control element III. The sensor circuit I preferably includes a transistor T4, the source of which is connected to the first supply potential VSS of the component circuit IV. The noise signals which are to be compensated for, occur at a point N which is connected to the gate of the transistor T4. The point N is thus connected to the first supply potential VSS through the parasitic resistor R, at which a small, variable voltage drops during operation due to Ohm's Law and because of the noise signals being produced. The drain of the transistor T4 is highly resistively connected through a load device (or "pull-up transistor") T5 to the second supply potential VDD of the component circuit IV, forming one output 1 of the sensor circuit I. During operation, the noise signal to be compensated for is therefore detected at the point N by the gate terminal of the transistor T4 and is converted through the source-to-drain path of the transistor T4, so that a signal corresponding to the noise signal is present at the output 1. This signal then serves as an input signal for the converter circuit II.

Advantageously, the operating voltage of the transistor T4 of the sensor circuit I, typically symbolized as $U_T$, amounts to 20% of the difference between the two supply potentials VDD and VSS. A figure of a maximum of 10% is even more favorable. A low operating voltage $U_T$ permits high sensitivity of the circuit configuration with respect to the noise signals and thus provides an earlier response of its compensatory action, which in the final analysis allows higher current values in the component circuit IV.

The converter circuit II preferably includes a discriminator circuit D with an integrator INT connected to the output side thereof. In particular, the discriminator circuit D may include a flip-flop. The subsequent integrator INT serves to avoid oscillation at the Q output of the discriminator circuit D. The input of the discriminator circuit D is connected to the output 1 of the sensor circuit I. The converter circuit II furthermore includes a digitizing circuit DIG, through which the interference signals that are integrated upward by the integrator INT, taking the signal 01 triggering the component circuit IV into account, are converted into digital signals and furnished as an input variable to the control element III. The digitizing system DIG preferably includes a logic gate configuration (having a NAND gate followed by an inverter as shown in the drawing), which links the signal 01 and the interference signals to one another and thus produces the digital signals.

The control element III preferably includes a transistor T3, as shown in FIG. 1. The source of the transistor T3 is connected to the point N at which the noise signals are produced. The drain of the transistor T3 is connected to a circuit node K of the component circuit IV. The gate of the transistor T3 is the control input of the control element III for the digital signals of the digitizing system DIG. During operation, upon the occurrence of the interference signals at the point N, the noise signals produced by the interference signals are compensated for at the circuit node K by contrary regulation of the flow of current in the control element III.

FIG. 2 shows a version of the circuit that is used to compensate for noise signals produced at connection points N' of the component circuit IV that are connected to the other supply potential VDD, which is more positive than the potential VSS. In order to adapt the circuit to the altered polarity conditions of the various transistors (for example, the source terminal of a load transistor T5' of the sensor circuit I is connected to the supply potential VSS instead of VDD), some n-channel transistors (of FIG. 1) are replaced with corresponding p-channel transistors. Circuit elements common to both drawing figures are assigned the same reference numerals. Circuit elements that are different but have the same kind of function are identified by the same reference numerals in FIG. 2 as in FIG. 1, but with an apostrophe. The explanation provided for FIG. 1 logically applies to FIG. 2 as well, so that one skilled in the art requires no further detailed description of FIG. 2. The only change is that the reference symbols, VSS for the first supply potential and VDD for the second supply potential in FIG. 1, are replaced with the other respectively symbols in FIG. 2; that is, the first supply potential in FIG. 2 is VDD, and the second supply potential is VSS. Thus the first supply potential VDD is more positive than the second supply potential VSS, in accordance with the nomenclature conventionally used by professionals in the field. Furthermore, one skilled in the art can also combine the two versions to compensate for noise signals that are produced at both terminal points N and N'.

The foregoing is a description corresponding in substance to European Application 88 119 151.4, dated Nov. 17, 1988, the International priority of which is being claimed for the instant application, and which is hereby made part of this application. Any material discrepancies between the foregoing specification and the aforementioned corresponding European application are to be resolved in favor of the latter.

We claim:

1. Circuit configuration for compensating for noise signals occurring in a component circuit of an integrated semiconductor circuit, comprising:
   a sensor circuit for detecting and converting noise signals that occur;
   a converter circuit connected to said sensor circuit for preparing and converting the detected noise signals into logic levels;
   a control element connected between said converter circuit and the component circuit for controlling the flow of current in the component circuit; and
   the flow of current in the component circuit defining a first current path, and said control element defining a second current path connected in parallel to said first current path.

2. Circuit configuration according to claim 1, wherein the component circuit is connected to first and second supply potentials, and has a point at which the noise signals to be compensated for occur; said sensor circuit includes a load device, and a transistor having a source, a drain and a gate; the source of said transistor is connected to the first supply potential; the drain of said transistor is highly resistively connected through said load device to the second supply potential; and the gate of said transistor is connected to the point at which the noise signals to be compensated for occur.

3. Circuit configuration according to claim 1, wherein the component circuit is triggered by a signal; said sensor circuit has an output; and said converter circuit includes:
   a) an integrator, a discriminator circuit upstream of said integrator for evaluating the noise signals present at said output of said sensor circuit and converted by said sensor circuit as interference signals and for upwardly integrating the noise signals; and b) a digitizing system downstream of said integrator for converting the upwardly integrated interference signals into digital signals while taking the signal triggering the component circuit into account and furnishing the digital signals to said control element as an input variable.

4. Circuit configuration according to claim 1, wherein the component circuit has a point at which the noise signals occur and a circuit node within the component circuit, and said control element includes a transistor having a source, a drain and a gate, the source of said transistor is connected to the point at which the noise signals occur, the drain of said transistor is connected to the circuit node, and the gate of said transistor forms a control input of said control element.

5. Circuit configuration according to claim 2, wherein the first supply potential is more negative than the second supply potential.

6. Circuit configuration according to claim 2, wherein the first supply potential is more positive than the second supply potential.

7. Circuit configuration according to claim 2, wherein said transistor of said sensor circuit has an operating voltage being at most 20% of the difference between the supply potentials in terms of amount.

8. Circuit configuration according to claim 2, wherein said transistor of said sensor circuit has an operating voltage being at most 10% of the difference between the supply potentials in terms of amount.

9. Circuit configuration according to claim 1, wherein the component circuit is connected to supply potentials, and including at least one conductor track being connected to one of the supply potentials and having parasitic resistances causing noise signals being compensated for by the circuit configuration.

* * * * *